United States Patent
Aikawa et al.

(10) Patent No.: US 6,771,048 B2
(45) Date of Patent: Aug. 3, 2004

(54) BATTERY STATE MONITORING CIRCUIT

(75) Inventors: Yasunori Aikawa, Chiba (JP); Atsushi Sakurai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/370,986

(22) Filed: Feb. 20, 2003

(65) Prior Publication Data

US 2003/0169050 A1 Sep. 11, 2003

(30) Foreign Application Priority Data

Feb. 28, 2002 (JP) .......................................... 2002-053387

(51) Int. Cl.$^7$ .............................................. H01M 10/46
(52) U.S. Cl. ...................................................... 320/132
(58) Field of Search ............................... 320/127, 128, 320/132, 134, 136, 163, DIG. 21

(56) References Cited

U.S. PATENT DOCUMENTS

| | | | | |
|---|---|---|---|---|
| 4,394,741 A | * | 7/1983 | Lowndes ................ | 340/825.52 |
| 4,433,278 A | * | 2/1984 | Lowndes et al. ............ | 320/116 |
| 4,484,130 A | * | 11/1984 | Lowndes et al. ............ | 320/116 |
| 5,107,191 A | * | 4/1992 | Lowndes et al. ............ | 318/139 |

* cited by examiner

*Primary Examiner*—Edward H. Tso
(74) *Attorney, Agent, or Firm*—Adams & Wilks

(57) ABSTRACT

A battery apparatus having a long duration (use time period) in which when a voltage of secondary batteries is a hysteresis voltage, in response to a charge inhibition signal outputted from a microcomputer and exhibiting that the secondary batteries should be in a charge inhibition state, a signal used to restrict charge of the secondary batteries is outputted to a charge control terminal and also a signal having information of the charge inhibition state is outputted to a secondary battery controlling circuit to suppress the output of a hysteresis voltage signal from the secondary battery controlling circuit.

2 Claims, 3 Drawing Sheets

BATTERY STATE MONITORING CIRCUIT

BACKGROUND OF THE INVENTION

1. Field of the Invention

The present invention relates to a battery state monitoring circuit capable of monitoring a state of a secondary battery and to a battery device provided with the secondary battery, a current controlling means, a battery state monitoring circuit, and the like.

2. Description of the Related Art

As shown in FIG. 2, a battery state monitoring circuit 20 is conventionally provided with battery voltage monitoring terminals 5 to 9, a charge control transistor gate connection terminal COP, a discharge control transistor gate connection terminal, and a control terminal 13 for a microcomputer 19. FIG. 4 shows a block diagram of a charge control circuit provided in the battery state monitoring circuit.

In a battery device 21, secondary batteries 1 to 4, a charge control transistor 14, a discharge control transistor 16, and a microcomputer 19 are connected with a battery state monitoring circuit 20 and external terminals, respectively. Either one of an external load 17 (for example, a CPU of a notebook personal computer etc.) that is operated by the supply of the electric power of the secondary batteries and a charger 18 for charging the secondary batteries 1 to 4 is connected between the external terminals of the battery device 21.

Now, when charging the secondary batteries with electricity, a charge completion signal is outputted from an IC upon charging fully the secondary batteries with electricity to stop the charging operation. At this time, a hysteresis voltage signal is outputted together with the charge completion signal. The hysteresis voltage in this case is provided in order to prevent the battery voltage from being reduced to carry out the recharge upon stopping the charging operation. If the level of the charge voltage becomes below a hysteresis voltage area, then the charge completion state is canceled, which makes it possible to recharge the secondary batteries with electricity (refer to FIG. 5).

On the other hand, when the charging operation is inhibited due to a high temperature or the like, a charge inhibition signal is outputted from the microcomputer irrespective of the charge completion signal. At this time, the hysteresis voltage signal is outputted together with the charge inhibition signal to stop the charging operation (refer to FIG. 6).

With conventional battery state monitoring circuit and battery apparatus, after generation/cancel of the charge inhibition signal from a microcomputer due to a high temperature or the like as shown in FIG. 6, it is impossible to recharge the secondary batteries with electricity. There is, as a result, encountered the problem that it is impossible to recharge the secondary batteries as long as the level of the discharge voltage becomes lower than that of the hysteresis voltage. Impossibility of the recharging operation means that the level of the battery voltage at the time concerned is lower than that of the battery voltage when the charging operation is completed, which results in that a time period of use of the secondary batteries at the time concerned becomes shorter than that when the secondary batteries are fully charged. In addition, there is encountered the problem that since the cycle of the charging operation is shortened, the batteries are quickly degraded.

SUMMARY OF THE INVENTION

In the light of the foregoing, the present invention has been made in order to solve the above-mentioned problems associated with the prior art, and it is, therefore, an object of the invention to provide a battery apparatus having a long duration (use time period).

In order to attain the above-mentioned object, the present invention may provide a battery state monitoring circuit in which the condition of "a hysteresis voltage is generated only when outputting a charge completion signal from an IC" is imposed on an output of a hysteresis voltage signal, and hence the hysteresis voltage signal can not be generated on the basis of only a charge inhibition signal outputted from a microcomputer.

BRIEF DESCRIPTION OF THE DRAWINGS

The foregoing and other objects are effected by the invention as will be apparent from the following description and claims taken in connection with the accompanying drawings, forming a part of this application in which:

DETAILED DESCRIPTION OF THE PREFERRED EMBODIMENTS

Figure 1:
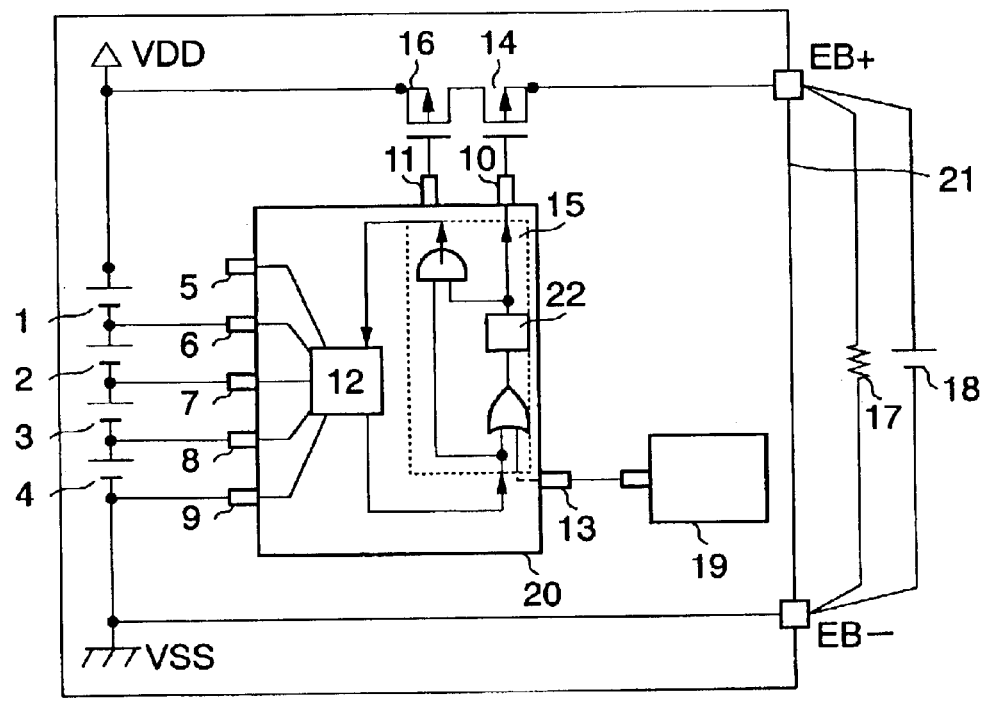
FIG. 1 is a block diagram, partly in circuit diagram, showing a configuration of an example of a battery state monitoring circuit and a battery apparatus according to the present invention.

FIG. 1 is a block diagram, partly in circuit diagram, showing the whole configuration of an example of a battery state monitoring circuit and a battery apparatus according to the present invention. As shown in FIG. 1, a battery state monitoring circuit 20 is conventionally provided with battery voltage monitoring terminals 5 to 9, a charge control transistor gate connection terminal COP, a discharge control transistor gate connection terminal, and a control terminal 13 for a microcomputer 19. A secondary battery controlling circuit 12 is for, in response to the signal outputted through the battery voltage monitoring terminal 5 to 9, outputting a charge completion signal exhibiting that secondary batteries 1 to 4 are in a full charge state, and a hysteresis voltage signal exhibiting that the voltage of the secondary batteries is a hysteresis voltage.

In a battery device 21, secondary batteries 1 to 4, a charge control transistor 14, a discharge control transistor 16, and a microcomputer 19 are connected with a battery state monitoring circuit 20 and external terminals, respectively. Either one of an external load 17 (for example, a CPU of a notebook personal computer etc.) that is operated by the supply of the electric power of the secondary batteries and a charger 18 for charging the secondary batteries 1 to 4 is connected between the external terminals of the battery device 21. Delay circuit 22 has an input terminal to which an output terminal of the OR circuit is connected.

Figure 3:
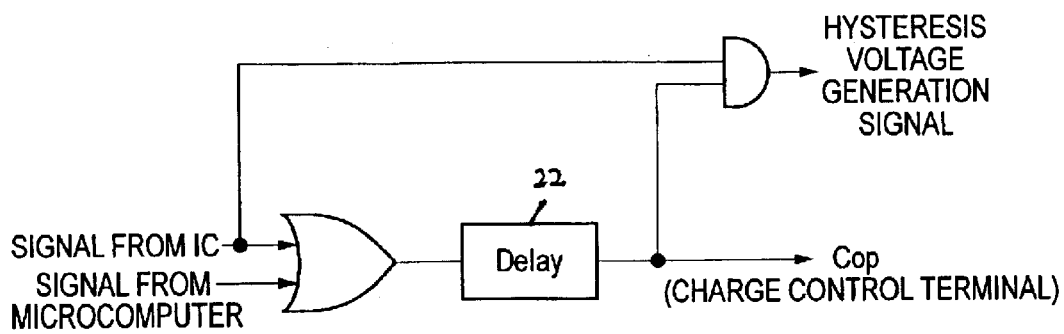
FIG. 3 is a block diagram showing a configuration of an example of a charge control circuit 15 according to the present invention.
Figure 4:
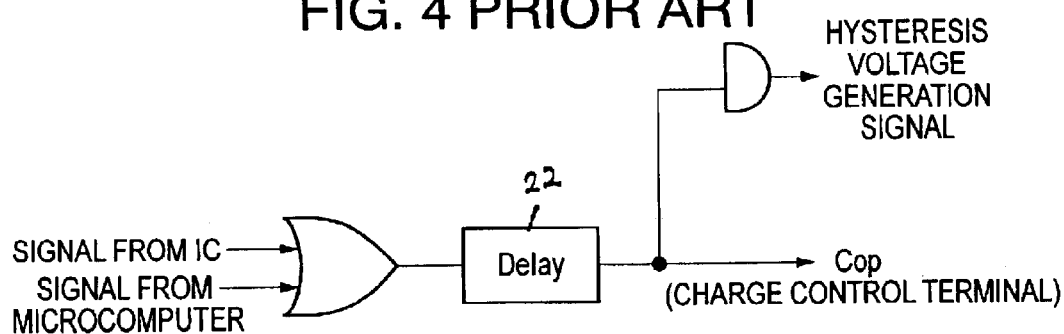
FIG. 4 is a block diagram showing a configuration of an example of a charge control circuit 15 according to the prior art.
Figure 5:
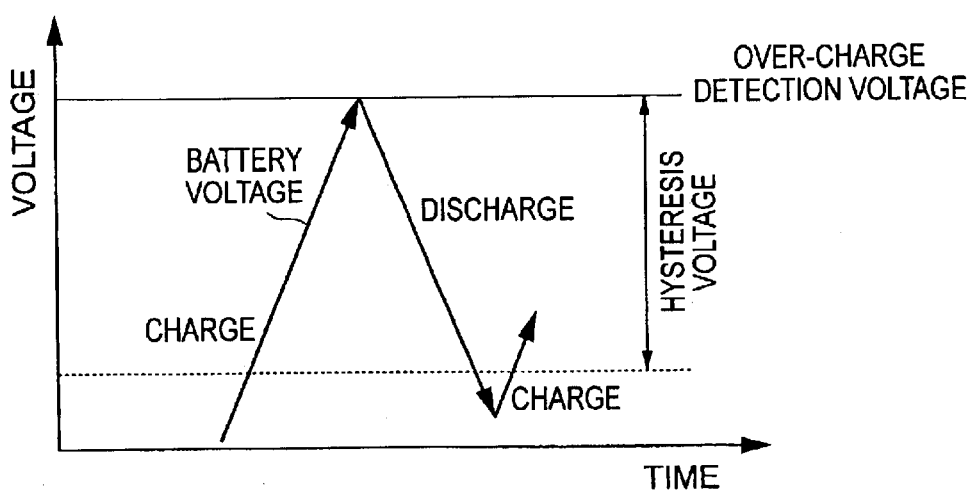
FIG. 5 is a waveform chart useful in explaining conventional charge and discharge.
Figure 6:
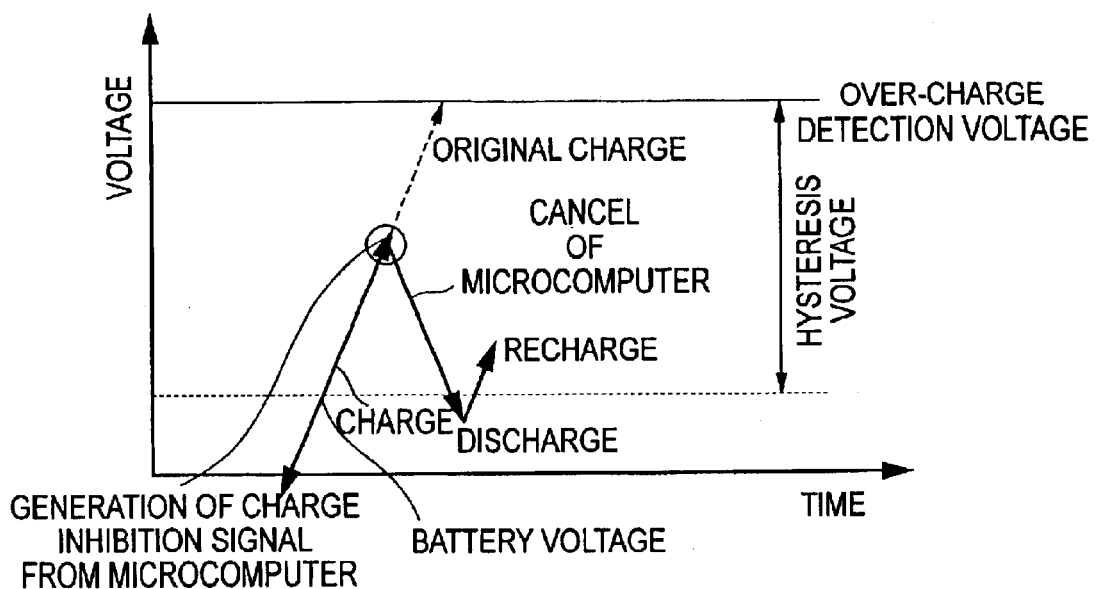
FIG. 6 is a waveform chart useful in explaining conventional charge and discharge in generating a inhibition signal and in canceling the inhibition signal.

FIG. 3 shows a block diagram of a charge control circuit provided in the battery state monitoring circuit. The charge control circuit 15 comprises an OR circuit having an input terminal connected to an output terminal of the secondary battery controlling circuit and the control terminal for a microcomputer. Delay circuit 22 has an input terminal to which an output terminal of the OR circuit is connected. AND circuit has an input terminal to which an output terminal of the Delay circuit and an output terminal of the secondary battery control circuit are connected, the output terminal of the Delay circuit is connected to the charge control terminal and an output terminal of the AND circuit is connected to the secondary battery controlling circuit.

Figure 2:
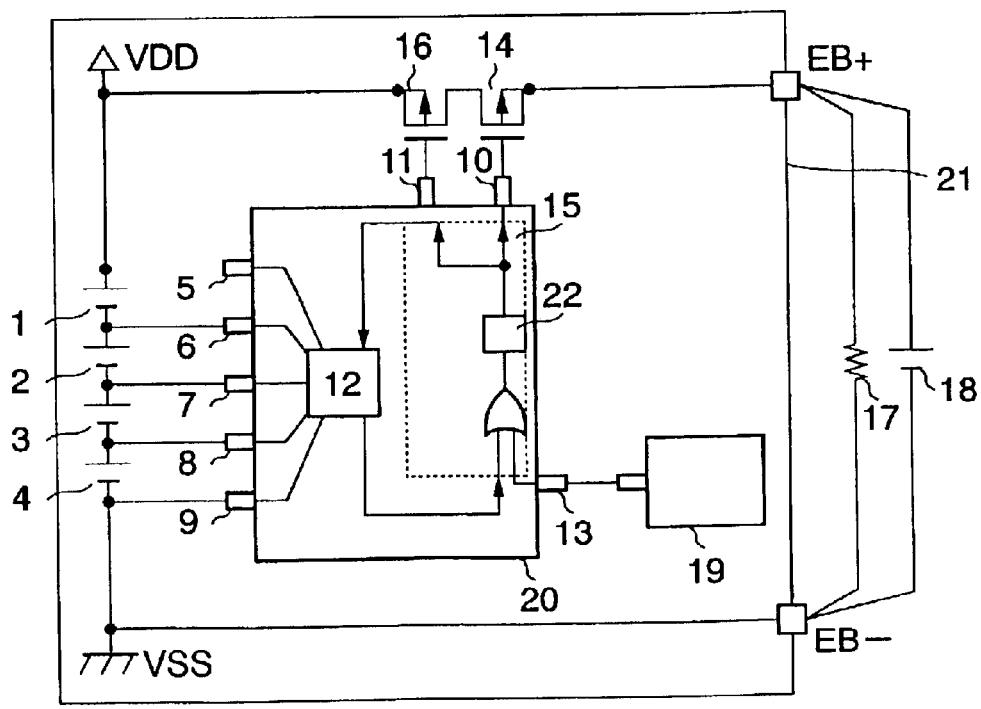
FIG. 2 is a block diagram, partly in circuit diagram, showing a configuration of an example of a battery state monitoring circuit and a battery apparatus according to the prior art.
Figure 7:
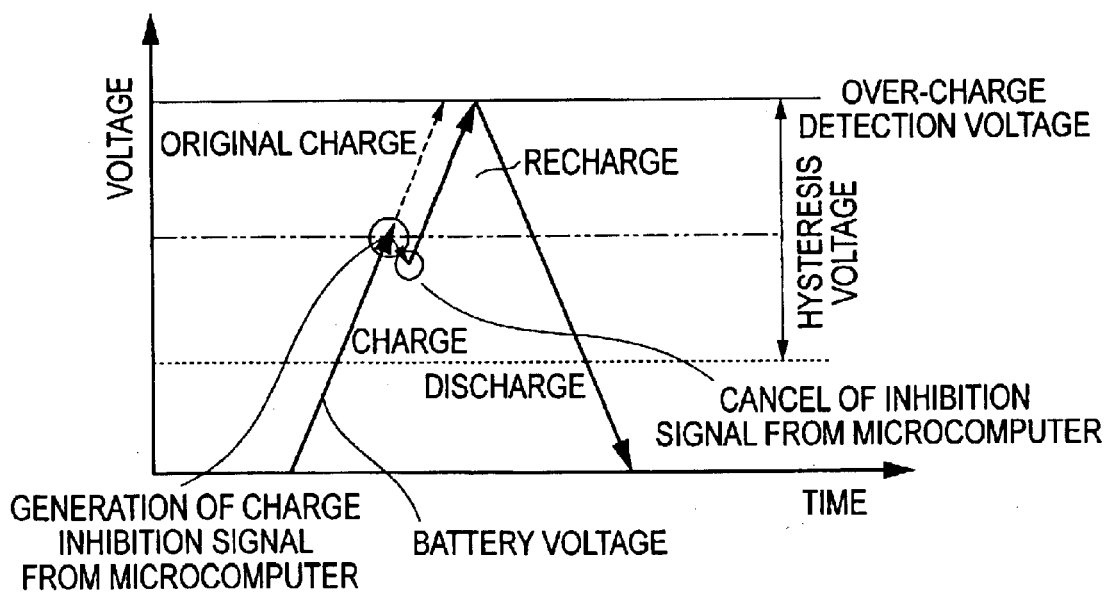
FIG. 7 is a waveform chart useful in explaining charge and discharge of the present invention in generating an inhibition signal and in canceling the inhibition signal.

In the present invention, the configuration of the inside of a charge control circuit 15 is changed as compared with that shown in FIG. 2. In addition, FIG. 7 is a wave form chart useful in explaining charge and discharge in generating an inhibition signal in the present invention. FIG. 3 is a block diagram showing a configuration of the inside of the charge control circuit 15.

The present invention will hereinafter be described with reference to FIGS. 3 and 7. In the present invention, a hysteresis voltage signal is outputted only when a charge completion signal is outputted from an IC. If an AND circuit, as shown in FIG. 3, is added to the conventional charge control circuit, then the hysteresis voltage signal is outputted only when the charge completion signal is being outputted from an IC (a secondary battery control circuit 12).

For example, if each of the charge inhibition signal and the charge completion signal is at a level H, then when the states of the IC and the microcomputer are both at a level H and when only the state of the IC (the secondary battery control circuit 12) is at a level H, an OFF signal is outputted to a charge control terminal (cop), and hence the hysteresis voltage signal is outputted. This is the full charge state. When only the state of the microcomputer is at a level H, the charge inhibition signal is outputted to cop, and hence no hysteresis voltage signal is outputted. Since no hysteresis voltage signal is generated at this time, it becomes possible to recharge the secondary batteries with electricity upon canceling the inhibition signal. When the states of the microcomputer and the IC are not at a level H, both of cop and the hysteresis voltage signal are not outputted.

As described above, in the present invention, even if the charge inhibition signal is outputted to the microcomputer due to a high temperature or the like, it becomes possible to carry out the recharge upon canceling the charge inhibition signal, and hence the charge voltage can be held in a maximum state at all times (refer to FIG. 7).

The substance of the present invention is such that any of other circuit configurations may also be adopted as long as it has the function of being able to carry out the recharge when the charge inhibition signal is canceled within the area of the hysteresis voltage generated together with a charge stop signal from the IC. Thus, the present invention is not intended to be limited to the above-mentioned embodiment.

As set forth hereinabove, according to the present invention, even when a charge inhibition signal is generated from a microcomputer due to a high temperature or the like, if the charge inhibition signal is canceled, then the recharge is carried out and hence secondary batteries can be continued to be used for the original use time period to increase the duration (use time period) of a load.

As many apparently widely different embodiments of this invention may be made without departing from the spirit and scope thereof, it is to be understood that the invention is not limited to the specific embodiment thereof except as defined in the appended claims.

What is claimed is:

1. A battery state monitoring circuit comprising:
   a charge control terminal through which a signal used to control the charge current of the secondary batteries is outputted;
   a discharge control terminal through which a signal used to control the discharge current of the secondary batteries is outputted;
   a battery voltage monitoring terminal through which the charge voltage of the secondary batteries is monitored;
   a secondary battery controlling circuit for, in response to the signal outputted through the battery voltage monitoring terminal, outputting a charge completion signal exhibiting that the secondary batteries are in a full charge state, and a hysteresis voltage signal exhibiting that the voltage of the secondary batteries is a hysteresis voltage;
   a control terminal for a microcomputer through which a signal used to manage/control a state of the charge/discharge current is inputted; and
   a charge control circuit for, in response to the charge completion signal and the signal used to manage/control a state of the charge/discharge current which is inputted through the control terminal for a microcomputer, outputting a signal used to control the charge of the secondary batteries to the charge control terminal,
   wherein the charge control circuit, when the voltage of the secondary batteries is the hysteresis voltage, in response to a charge inhibition signal outputted from the microcomputer and exhibiting that the secondary batteries should be in a charge inhibition state, outputs a signal used to restrict the charge of the secondary batteries to the charge control terminal and also outputs a signal having information of the charge inhibition state to the secondary battery controlling circuit to suppress the output of the hysteresis voltage signal from the secondary battery control circuit.

2. A battery state monitoring circuit according to claim 1; wherein the charge control circuit comprises an OR circuit having an input terminal connected to an output terminal of the secondary battery controlling circuit and the control terminal for a microcomputer, a Delay circuit having an input terminal to which an output terminal of the OR circuit is connected, and an AND circuit having an input terminal to which an output terminal of the Delay circuit and an output terminal of the secondary battery control circuit are connected, the output terminal of the Delay circuit is connected to the charge control terminal and an output terminal of the AND circuit is connected to the secondary battery controlling circuit.

* * * * *